United States Patent
Bromberger et al.

(10) Patent No.: US 6,806,131 B2
(45) Date of Patent: Oct. 19, 2004

(54) PROCESS FOR MANUFACTURING A DMOS TRANSISTOR

(75) Inventors: Christoph Bromberger, Leingarten (DE); Franz Dietz, Heilbronn (DE); Volker Dudek, Korntal-Muenchingen (DE); Michael Graf, Leonberg (DE); Joern Herrfurth, Heilbronn (DE); Manfred Klaussner, Heilbronn (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 10/167,960

(22) Filed: Jun. 11, 2002

(65) Prior Publication Data

US 2003/0003638 A1 Jan. 2, 2003

(30) Foreign Application Priority Data

Jun. 29, 2001 (DE) .......................................... 101 31 707

(51) Int. Cl.$^7$ ................... H01L 21/8238; H01L 21/336; H01L 21/76; H01L 21/425

(52) U.S. Cl. ....................... 438/221; 438/302; 438/433; 438/524; 438/525; 438/527

(58) Field of Search ................................. 438/221, 302, 438/433, 524, 525, 527, 390, 369; 257/335, 339, 330, 382, 328

(56) References Cited

U.S. PATENT DOCUMENTS

| | | | | |
|---|---|---|---|---|
| 4,756,793 A | * | 7/1988 | Peek ........................... | 438/524 |
| 4,808,543 A | * | 2/1989 | Parrillo et al. .............. | 438/390 |
| 4,893,160 A | * | 1/1990 | Blanchard ................... | 257/334 |

(List continued on next page.)

FOREIGN PATENT DOCUMENTS

| | | |
|---|---|---|
| DE | 19733974 | 8/1998 |
| DE | 69316256 | 8/1998 |
| EP | 0176778 | 4/1986 |
| EP | 0209949 | 1/1987 |
| EP | 0232322 | 8/1987 |
| EP | 0547711 | 6/1993 |
| EP | 0562271 | 9/1993 |
| EP | 0837509 | 4/1998 |
| EP | 0905784 | 3/1999 |
| JP | 55130173 | 10/1980 |
| JP | 56040280 | 4/1981 |
| JP | 56050558 | 5/1981 |
| JP | 56062365 | 5/1981 |
| JP | 56085857 | 7/1981 |
| JP | 58204569 | 11/1983 |
| JP | 2001-12842 | 1/2000 |

OTHER PUBLICATIONS

"Process for Doping a Semiconductor Body", by Christoph Bromberger et al.; U. S. patent application 10/170,098; Jun. 11, 2002, pp. 1 to 16 and 1 sheet of drawings.

"Process for Manufacturing a DMOS Transistor", by Christoph Bromberger et al.; U. S. patent application 10/167,961; Jun. 11, 2002, pp. 1 to 14 and 2 sheets of drawings.

"Process for Manufacturing a DMOS Transistor", by Christoph Bromberger et al.; U. S. patent application 10/167,959; Jun. 11, 2002, pp. 1 to 14 and 2 sheets of drawings.

Primary Examiner—John F. Niebling
Assistant Examiner—Ron Pompey
(74) Attorney, Agent, or Firm—W. F. Fasse; W. G. Fasse

(57) ABSTRACT

In a new process of making a DMOS transistor, the doping of the sloping side walls can be set independently from the doping of the floor region in a trench structure. Furthermore, different dopings can be established among the side walls. This is achieved especially by a sequence of implantation doping, etching to form the trench, formation of a scattering oxide protective layer on the side walls, and two-stage perpendicular and tilted final implantation doping. For DMOS transistors, this achieves high breakthrough voltages even with low turn-on resistances, and reduces the space requirement, in particular with regard to driver structures.

48 Claims, 2 Drawing Sheets

U.S. PATENT DOCUMENTS

| | | | |
|---|---|---|---|
| 4,975,384 A | 12/1990 | Baglee | |
| 5,338,965 A | 8/1994 | Mahli | |
| 5,387,534 A | 2/1995 | Prall | |
| 5,466,616 A | 11/1995 | Yang | |
| 5,539,238 A | 7/1996 | Malhi | |
| 5,569,949 A | 10/1996 | Malhi | |
| 5,696,010 A | 12/1997 | Malhi | |
| 5,763,915 A * | 6/1998 | Hshieh et al. | 257/330 |
| 5,780,353 A | 7/1998 | Omid-Zohoor | |
| 5,844,275 A * | 12/1998 | Kitamura et al. | 257/335 |
| 5,846,866 A | 12/1998 | Huang et al. | |
| 5,869,875 A * | 2/1999 | Hebert | 257/382 |
| 5,874,346 A | 2/1999 | Fulford Jr. et al. | |
| 5,882,966 A * | 3/1999 | Jang | 438/234 |
| 5,915,195 A | 6/1999 | Fulford, Jr. et al. | |
| 5,929,481 A * | 7/1999 | Hshieh et al. | 257/328 |
| 5,960,276 A | 9/1999 | Liaw et al. | |
| 6,072,216 A * | 6/2000 | Williams et al. | 257/339 |
| 6,150,235 A | 11/2000 | Doong et al. | |
| 6,184,566 B1 | 2/2001 | Gardner et al. | |
| 6,190,954 B1 * | 2/2001 | Lee et al. | 438/199 |
| 6,228,726 B1 | 5/2001 | Liaw | |

* cited by examiner

PROCESS FOR MANUFACTURING A DMOS TRANSISTOR

BACKGROUND

1. Field of the Invention

The present invention relates to a process for manufacturing a DMOS transistor.

2. Description of the Related Technology

Such a process is known from the printed publication U.S. Pat. No. 5,539,238. Here, a DMOS transistor with a deep trench structure is generated, with the doped regions adjoining the side walls and the base region representing the so-called drift zone of the transistor. Due to the partially vertical implementation of the drift zone along the side walls of the trench, the length of the transistor can be reduced. The disadvantage in this process is that for an applied blocking voltage inhomogeneities in the course of the potential occur on the edges of the trench structure, which cause an undesirable reduction in the transistor blocking voltage. Furthermore, the total length of the drift region is not decreased but only subdivided into a vertical and a lateral share, that is, the specific turn-on resistance Rsp=Rdson/region is not decreased, rather the side walls can only be doped insufficiently; and the specific turn-on resistance, and thus the surface area used by the transistor, are increased.

A further process is known from the printed publication EP 0 837 509 A1. Here, a self-adjusted drift region is generated in a DMOS transistor below a LOCOS oxide. The disadvantage is that the doping of the drift region is introduced before oxidation and that the share of the doping agent diffusing into the oxide can be determined with some imprecision only. In addition, the high temperature load during oxidation causes a wide distribution of the doping agent, which in turn leads to a higher imprecision in the doping agent concentration. Furthermore, a large silicon thickness is required underneath the oxide in order to increase the blocking voltage by means of the so-called "RESURF" effect. Overall, the process scatterings increase the scatter in the electrical parameters of the transistor.

One development aim in the area of DMOS transistors is to manufacture space-saving structures which, for an applied blocking voltage, feature low field strengths, in order to avoid a generation of load carriers that lead to a breakthrough within the component. A further aim in the development of DMOS transistors is to achieve a low specific turn-on resistance, Rsp, in order to reduce the spatial area required by such an integrated circuit in the case of integrated circuits where DMOS transistors take up a significant part of the total chip surface area.

SUMMARY OF THE INVENTION

The present invention is based on the task to state a process by means of which DMOS transistors can be provided on a compact surface area for high blocking voltages.

The above object has been achieved according to the invention by a process as defined in the claims.

In accordance with the above, the invention essentially provides a process wherein a trench-shaped structure is generated in a DMOS transistor where, by selecting the doping agent profile within the region of the trench-shaped structure, a high breakthrough voltage for a low lateral expansion of the DMOS transistor is achieved. As produced by this process, a semiconductor body of a first conductivity type features a surface layer in which a source region and a drain region of a second conductivity type, and a first well region of a first conductivity type that encloses the source region, and a second well region of a second conductivity type that encloses the drain region, are formed. Furthermore, a body region is formed between the first well region and the second well region in the semiconductor body. Also, on the surface of the semiconductor body, a gate region is formed, which—starting at the source region—extends across the first well region. Still further, starting at the surface of the semiconductor body the trench-shaped structure is formed in a part of the surface layer. In the floor region of the trench-shaped structure, a doping of a second conductivity type with a first concentration, and in the source-end side wall of the trench-shaped structure a doping of the second conductivity type with a second concentration, and in the drain-end side wall of the trench-shaped structure a doping of the second conductivity type with a third concentration, are generated.

An essential advantage of the new process is that, due to the different concentration of the doping agent in the source-end side wall compared to the drain-end side wall in connection with the doping agent concentration in the floor region of the trench-shaped structure, which together define the drift range of the transistor, a simple optimization within a parameter field essentially determined by the specific turn-on resistance Rsp, breakthrough voltage Vbreak, and the size and shape of the SOA (safe-operation-area), can be carried out. In particular for driver structures it thus becomes possible to generate transistors with a compact total area. Furthermore, the RESURF effect can be optimized particularly advantageously with regard to: starting point, using different doping agent concentrations; strength, by means of an adjustable vertical distribution of the potential gradient for the applied blocking voltage. As doping is effected only after silicon etching with a low implantation energy, and no thick LOCOS-oxide with a high temperature load is generated next, spatially highly doped regions can be generated along a short vertical route underneath the floor of the trench-shaped structure; these spatially highly doped regions form a buried current path with low resistance. As the doping of the floor—by means of the RESURF-effect in connection with the doping course in the source-end side wall—has an essential influence on the breakthrough voltage in a blocking as well as in a switched on condition, whilst the drain-end doping agent course has an essential influence on the turn-on resistance Rdson, an adaptation of the doping profiles along the trench-shaped structure to the electrical requirements is particularly advantageous. Furthermore, the space used by the transistors is reduced as, due to the self-adjustment in connection with a simultaneously reduced temperature load compared with a LOCOS oxidation, the process scattering of the doping agent profiles introduced into the trench-shaped structure are reduced.

In a further embodiment of the process, it is advantageous to expand the region of the second well in the direction of the source and to generate the trench-shaped structure partially or wholly within the region of the second well. The further the second well extends in the direction of the source, the more the specific turn-on resistance Rsp is reduced, as the floor region of the trench-shaped structure and the second well feature the same doping polarity. It is advantageous here, underneath the trench-shaped structure in the vicinity of the source-end floor region between the second well and the body region, to increase the breakthrough voltage by forming a lateral PN junction utilizing the RESURF effect. As the body region concentration is lower than that of the two well dopings, the spatial charge zone expands into the body region when blocking voltage is applied.

In a further embodiment of the process, an extension region is generated underneath the drain-doping region, which extension region completely encloses the drain region, with the doping of the extension region being of the same conductivity type, but featuring a lower concentration than the drain region. In addition to the suppression of a drain-end breakthrough, the reduction of the resistance within the drain-end side wall region reduces the specific turn-on resistance Rsp. The specific turn-on resistance Rsp is reduced particularly strongly if the extension region and/or the drain-end region connect immediately to the drain-end side wall of the trench-shaped structure.

Investigations carried out by the applicant have shown that in the breakthrough region of the transistor, by means of a distance between the drain-end side wall of the trench-shaped structure and the extension region and/or the drain-end—which is preferably between 0.5 $\mu$m and 4.0 $\mu$m—, a balancing can be achieved. Here, by means of the additional drain-end resistance causing a voltage drop, a local excessive increase in the current density is suppressed. In particular in connection with a clamp controller, advantageous ESD protective structures can be produced by means of such transistors.

In a further development of the process, in the side walls and in the floor region of the trench-shaped structure, a higher doping agent concentration than in the body region is generated, in order to increase the maximum blocking voltage by means of the RESURF effect, and also to reduce the specific turn-on resistance Rsp.

In another development of the process, the same doping agent concentration is generated in the source-end side wall as well as in the drain-end side wall of the trench-shaped structure. This simplifies the introduction of the doping agent and increases the specific turn-on resistance Rsp by only a minor degree, as the individual doping agent concentrations add up, if the extension region and the drain region start immediately on the side wall of the trench-shaped structure, and if the introduction depth of the drain-end doping lies within the range of the trench-shaped structure. Furthermore, it is advantageous—in particular with regard to deep trench-shaped structures—to generate a higher doping agent concentration in the drain-end side wall than in the source-end side wall, in order to obtain a lower turn-on resistance Rsp.

Investigations by the applicant with regard to different doping agent concentrations for wall and floor have shown that it is advantageous, if the aspect ratio of the trench-shaped structure is above 0.5, and features a trench-shaped structure with a width in a range between 0.5 $\mu$m and 4.0 $\mu$m. In order to suppress excessive field strength increases on the edges of the trench-shaped structure, it is advantageous to generate inclined side walls, that is, the trench-shaped structure features a narrower width in the floor region than on the surface. The generation of the trench-shaped structure can be carried out by means of a dry etching process such as, for example, a shallow trench process (STI), and filled up with an isolating material such as a CVD-oxide or nitride, and planarized by the use of a CMP process.

In another development of the process, the trench-shaped structure is generated by means of a V trench etching process and filled up in a following LOCOS oxidation which, due to the lower temperature load, is preferably produced by high pressure oxidation. The doping of the side walls and the floor is carried out prior to the LOCOS oxidation, with the infed dosage of doping agents being increased by that proportion which is diffused into the oxide during oxidation.

In a further development of the process, the DMOS transistor is generated in the surface layer of a wafer with an isolating intermediate layer. It is advantageous here, if the thickness of the residual surface layer underneath the trench-shaped structure is between one half and a factor 5 of the depth of the trench-shaped structure. it is furthermore advantageous, if the drain-end region and/or extension region, the body region and the two well regions as well as the source region connect immediately to the isolating intermediate layer in order to suppress the parasitic capacitances. A further advantage is that the required layer thickness of the surface layer is within a range of just a few $\mu$m, as the formation of a highly doped buried channel connecting to the floor of the trench-shaped structure features only a low vertical extension.

Investigations by the applicant have shown that the DMOS transistors produced by the process in accordance with the invention, in particular when using a silicon wafer with an isolating intermediate layer, are especially suitable for the manufacture of high blocking integrated circuits featuring an output driver for driving inductive loads.

BRIEF DESCRIPTION OF THE FIGURES

In the following, the process according to the invention is to be explained in more detail by means of embodiment examples and in connection with several block diagrams. The figures below show.

DESCRIPTION OF THE PREFERRED EMBODIMENTS

Table 1 shows a process sequence for manufacturing DMOS transistors, into which—based on the BCDMOS process sequence known from the current state of the art—the process steps 4 to 8 are additionally inserted. This generates a trench-shaped structure between the source and drain regions of N- or P-DMOS transistors, with a freely selectable doping in the respective side wall and a separately selectable doping in the floor region. With such process sequences, it is possible to produce at the same time N- and P-DMOS transistors, bipolar and complementary MOS transistors for an integrated circuit.

Table 1: Standard DMOS Module:
1. Material start: Silicon wafer with an isolating intermediate layer
2. Formation of the P-well (mask step)
3. Formation of the N-well (self-adjusted to P-well)
4. FORMATION OF THE WINDOW FOR A TRENCH-SHAPED STRUCTURE (MASK STEP)
5. TILT-IMPLANTATION (FOR SIDE WALL)
6. FORMATION OF A TRENCH-SHAPED STRUCTURE BY MEANS OF ANISOTROPE SILICON ETCHING (STI PROCESS) (MASK STEP)
7. FORMATION OF A PROTECTIVE LAYER BY OXIDATION/DIFFUSION OF THE IMPLANTED DOPING
8. IMPLANTATION VERTICAL AND TILT (FOR FLOOR- AND DRAIN-END SIDE WALL) (MASK STEP)
9. Formation of component boxes by means of a deep trench process (mask step)

10. Filling of the trench windows, or the trench-shaped structure, with CVD-OXIDE
11. CMP-planarization
12. Extension-implantation (mask step)
13. Threshold voltage implantation (mask step)
14. Gate oxidation
15. Gate poly separation and structuring (mask step)
16. LDD implantation (mask step)
17. Source/Drain implantation (mask step)
18. BPSG-separation
19. Etching of contact windows (mask step)
20. Metal1 (mask step)
21. Via-etching (mask step)
22. Metal2 (mask step)

The starting point for the manufacture of a DMOS transistor in accordance with the process sequence shown is a silicon wafer with an isolating intermediate layer (SOI wafer). Following the definition of the wells, a window is defined by means of mask step 4, through which window the doping for the side walls of the structure to be generated is implanted by means of a subsequent step 5. In the following step 6, a trench-shaped structure is produced by silicon etching, and then, in a follow-on step 7, the side walls are lined with a protective layer. In a follow-on step 8, a two-stage implantation for doping the floor- and the drain-end side wall is carried out. As the process steps 4 to 8 are carried out with a single mask, the implantations thus introduced are self-adjusted. The filling of the trench-shaped structure is implemented jointly with the filling of the trench structures. In further process steps, the gate regions and the source/drain regions are defined and connected to the printed circuit path system by means of a contact window process. Due to the use of an SOI wafer with a trench isolation, the transistors produced are located in individual component boxes isolated from each other.

Figure 1:
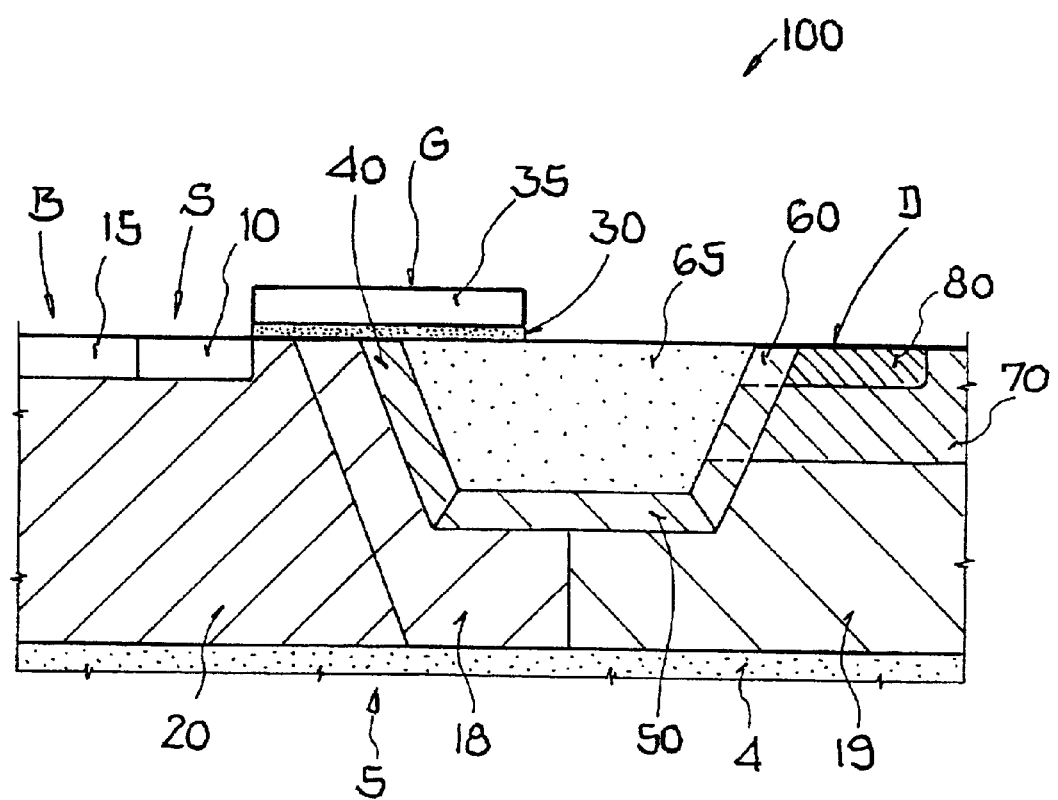
FIG. 1 a cross-section of a DMOS transistor with a trench-shaped structure in the drift region, and FIG. 2a a cross-section of the doping layers for a DMOS transistor between the gate and drain regions, and FIG. 2b a potential course for the DMOS transistor from FIG. 2a, with a blocking voltage applied.

In the following, FIG. 1 is explained; this shows a block diagram with a cross-section of an N-DMOS transistor 100 with a trench-shaped structure. The manufacture of an N-DMOS transistor 100 is implemented by means of a process sequence (not shown here) within a semiconductor body 5 featuring an isolating intermediate layer 4. To this end, in a first process step, a P well region 20 and an N well region 19, with an intermediate P body region 18, are produced in the semiconductor body. In a subsequent process step, within a protective layer consisting for example of a nitride and/or oxide, a mask step is used to produce a window for the introduction of a doping agent with negative polarity such as arsenic or phosphor. In order to increase the drain-end concentration of the doping agent, the implantation is made at a tilt angle of 60 degrees, for example. In a following process step, a trench-shaped structure is produced by means of anisotrope silicon etching, for example by means of STI etching, and the doping agent in the floor region is removed completely. In a following process step, a scattering oxide is produced whose thickness is sufficient to suppress effectively the doping agent infeed by means of a second implantation in the floor region of the trench-shaped structure. As the side walls are only slightly inclined, oxide thicknesses within the range of just a few 100 A suffice for this purpose. Due to the oxidation step, the doping agent remaining from the first implantation step is simultaneously diffused, with a first region 40 with a first concentration forming at the source end, and a second region 60 with a second concentration forming at the drain end. In a following process step, in a second implantation step which is carried out in two stages, a doping agent with a negative polarity is introduced. Here, in the first stage, a part of the total dosage is introduced vertically, that is, only into a floor region 50, and in the second stage the remaining dosage is introduced at a tilt angle of 60 degrees, for example, so that the concentration levels in the drain-end region of the floor 50 and in the drain-end side wall 60 are increased even further. In summary, following the two implantation steps, the region 60 features a high concentration, the region 50 a medium concentration, and the region 40 a lower concentration, of a doping agent with negative polarity. In a following process step, the trench-shaped structure is filled with an isolating material, with a CVD oxide 65 for example, and the surface of the trench-shaped structure is planarized by a CMP step. In several following process steps that are immanent in known MOS process architectures, a gate connection G with a gate oxide 30 and a poly-silicon layer 35 is produced. Furthermore, in subsequent process steps that are also known, a source connection S with a highly doped region 10 and a drain connection D with a highly doped region 80, which feature a negative polarity, as well as a body connection B with a highly doped region 15 featuring a positive polarity, is produced. Also, below the drain connection D, an extension region 70 with negative polarity is produced, whose concentration is lower than the concentration in the region 80. Furthermore, the extension region 70 and the drain region 80 connect immediately to the drain-end side wall of the trench-shaped structure so that the concentrations of regions 60, 70, 80 add up along the side wall. Additionally, the region of the source connection 10 is enclosed by the P well region 20, with the P well being separated from the N well by the P body region in a lateral direction. Also,-the P well region 20 and the N well region 19 border directly onto the isolating intermediate layer 4.

The particular advantage in the process sequence shown is that it can be used to produce jointly N-DMOS as well as P-DMOS transistors, with the temperature load during the production process being significantly reduced due to the trench-shaped structure being produced by dry etching. In this way, spatially delimited regions with differently high dopings can be produced along the trench-shaped structure parts, by means of which spatially delimited regions it is then easy to optimize the electrical parameters of the DMOS transistor. In particular, with the low specific turn-on resistances Rsp and the simultaneous high blocking voltages, large current carrying capacities on a compact surface area can be produced, as a.o. the voltage drop within the drift range of the transistor reduces. Furthermore, by adding epitaxy layers and/or buried layers, it is possible to isolate the DMOS transistors against each other using just a few additional process steps, if wafers without an isolating intermediate layer are used. Furthermore, due to the formation of the N well in the drift range region of the transistor, the saturation current Idsat is increased. Additionally, the blocking voltage increases as the N well 19 region, in comparison to the extension region 70, features a reduced doping agent concentration and is separated from the P well by the lowly doped P body region 18. In this way, high blocking voltages are achieved even in a turned-on condition, but with the specific turn-on resistance Rsp remaining low.

Figure 2A:
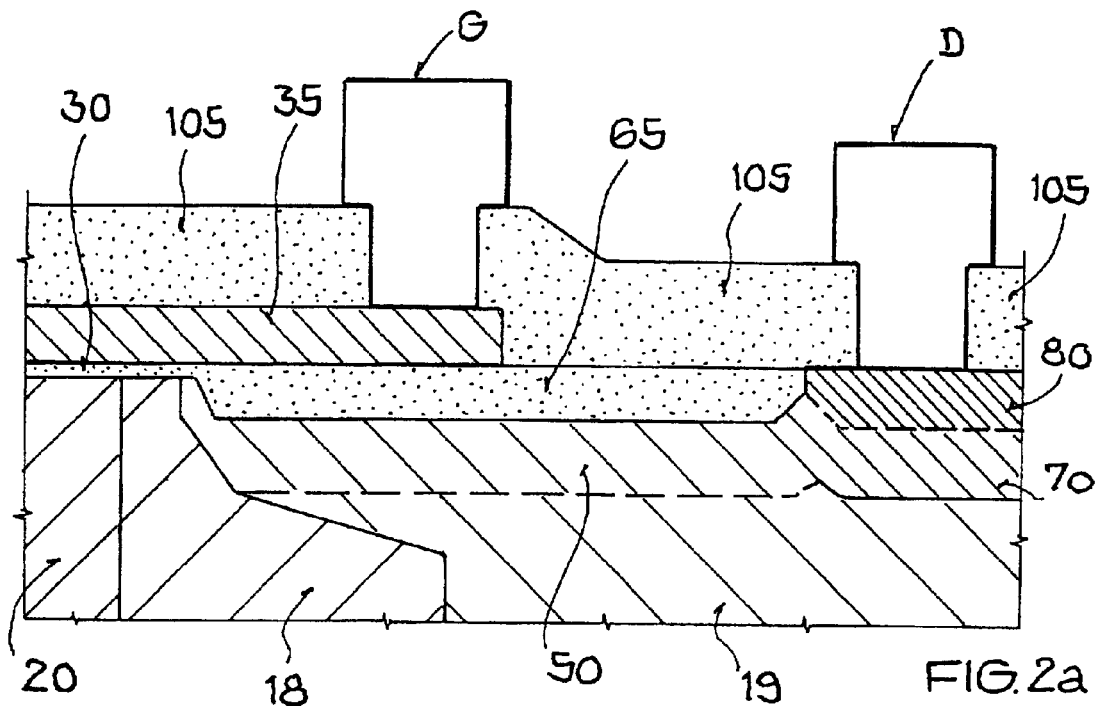

FIG. 2a shows a cross-section view of the doping layers of the part between gate region 35 and drain region 80 of the N-DMOS transistor 100 from FIG. 1. The N-DMOS 100 is produced by a process sequence as explained in connection with the drawings of FIG. 1, with—in extension—a passivizing layer made of oxide 105 being applied to the surface of the semiconductor structure. Furthermore, the layer 105 features a window for the gate connection G as well as a window for the drain connection D, which are both filled by a metal. Moreover, in the regions 18, 19, 20, 35, 50, 70, and 80 the polarity of the doping agent is represented by the direction of the hatching. Here, those regions which feature a negative polarity are hatched by lines from the top left to the bottom right, and those regions which feature a positive polarity are hatched by lines from the top right to the bottom left. Furthermore, the level of doping agent concentration in the respective region is represented by the density of the hatching. Furthermore, the N well 19 region includes the extension region 70, with the N well 19 region and the region of P well 20 featuring comparable doping agent concentration levels. Moreover, the P body region features a lower doping agent concentration in comparison to the wells. Also, underneath the trench-shaped structure in the PN junction, a region with a lateral component is produced which is located between the P body region 18 and the N well region 19.

Figure 2B:
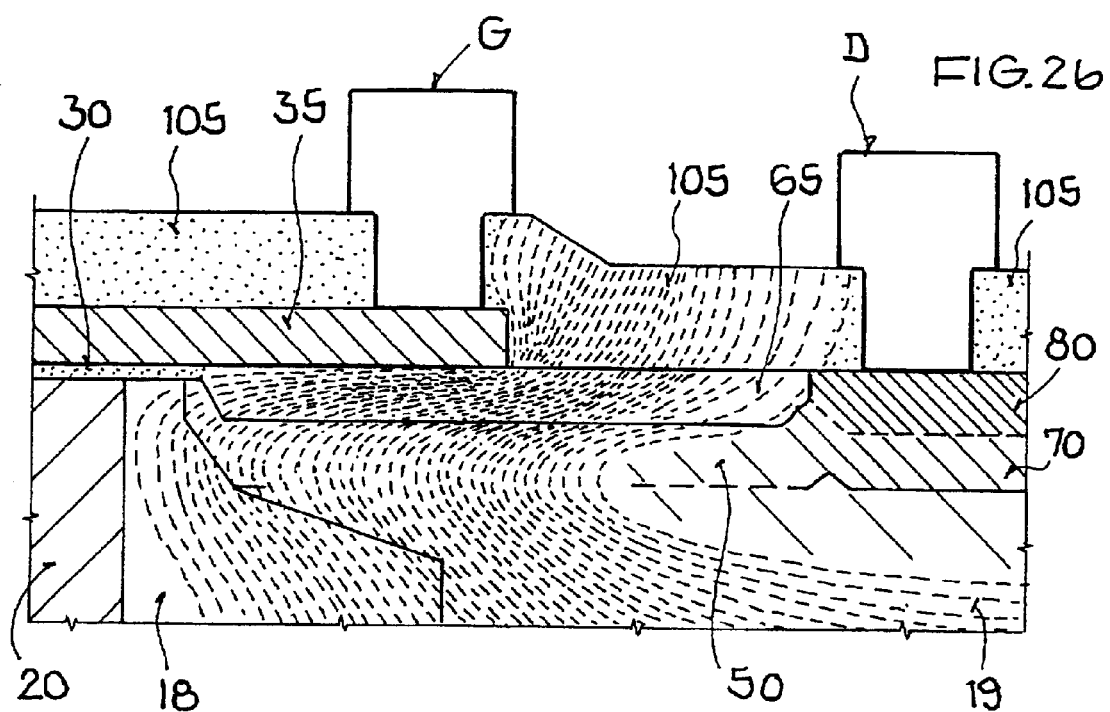

FIG. 2b shows the potential course for the transistor illustrated in FIG. 2a, with a blocking voltage applied, just ahead of the breakthrough. Here, the family of the individual potential lines represents the potential course between the channel region underneath the gate oxide 30 and the region of drain 70, 80, with the location of the highest field strength being represented by the location with the highest density of potential lines. Here it becomes clear that the transistor features an even distribution of the potential lines within the drift range, with the RESURF effect being reinforced in particular by the lateral formation of the PN junction below the trench-shaped structure between the P body and the N well. In particular, the region of the source-end side wall in the trench-shaped structure is preferably cleared by the formation of a spatial load zone, so that the RESURF effect already starts at low voltages and field strength peaks are avoided. Due to the even distribution of the potential lines within the drift range, high blocking voltages are achieved whose height is essentially determined by the concentrations of the doping agents in the N well region 18 and P body region 19. Furthermore, due to the high concentration of the doping agent—in particular in the drain-end region of the trench-shaped structure—in connection with the N well, the current carrying capacity ldsat of the DMOS transistor is increased and the specific turn-on resistance is reduced. This reduces the region requirement in particular for driver applications with high currents and high voltages.

A further advantage is the easy transfer of the new process to wafers featuring an isolating intermediate layer such as SOI wafers, for example. The vertically delimited highly doped regions below the trench shaped structure reduce the thickness of the surface layer, with the formation of a lateral PN junction below the trench-shaped structure causing high blocking voltages to be achieved—even in a turned-on condition. Furthermore, the underlyin isolating intermediate layer reinforces the RESURF effect by means of an immanent bundling of the potential lines and increases the blocking voltages between drain and source means of the low field strength within the drift range. In particular, the layer thickness for the surface layer located on the isolating intermediate layer can be kept low, and further component types such as, for example, bipolar and MOS transistors can be integrated together with the DMOS transistors on a single wafer—at low cost and requiring just a few additional process steps. Additionally, in particular due to the low thickness of the surface layer, the parasitical capacities can be suppressed by extending a part of the doping regions—such as, for example, the P well, the N well, the P body, and the extension region—right up to the isolating intermediate layer.

What is claimed is:

1. A process for manufacturing a DMOS transistor (100) with a semiconductor body (5), which features a surface layer with a source region (10) and a drain region (80) of a second conductivity type, and a first well region (20) of a first conductivity type enclosing the source region (10), and a second well region (19) of a second conductivity type enclosing the drain region, wherein the first well region (20) and the second well region (19) are separated by a body region (18) of a first conductivity type, and a gate region (35) is formed on the surface of the surface layer of the semiconductor body (5), which gate region extends from the source region across the first well region (20), said method comprising:

starting on the surface of the semiconductor body (5), forming a trench-shaped structure in the surface layer, such that the trench-shaped structure includes a floor region, source-end side wall extending from the floor region to the surface on a first side of the trench-shaped structure proximate to the source region, and a drain-end side wall on a second side of the trench-shaped structure proximate to the drain region, wherein at least one of the side walls slopes non-perpendicularly relative to the surface so that the trench-shaped structure has a tapering cross-section with a greater width at the surface than at the floor region;

producing a doping of the second conductivity type with a first concentration value in the floor region of the trench-shaped structure;

producing a doping of the second conductivity type with a second concentration value in the source-end side wall of the trench-shaped structure;

producing a doping of the second conductivity type with a third concentration value in the drain-end side wall of the trench-shaped structure; and forming, in the surface layer, the source region and the drain region of the second conductivity type, the first well region of the first conductivity type enclosing the source region, and the second well region of the second conductivity type enclosing the drain region, with the body region of the first conductivity type being between and separating the first and second well regions, and forming the gate region the surface of the surface layer so that the gate region extends from the source region over the first well region.

2. The process according to claim 1, wherein the trench-shaped structure is produced partially or wholly within the second well region (19).

3. The process according to claim 1, further comprising producing an extension region (70) of a second conductivity type which encloses the drain region (80) below the drain region.

4. The process according to claim 2, further comprising producing an extension region (70) of a second conductivity type which encloses the drain region (80) below the drain region.

5. The process according to claim 1, further comprising producing the drain region (80) immediately adjacent to the drain-end side wall of the trench-shaped structure.

6. The process according to claim 4, further comprising producing the drain region (80) immediately adjacent to the drain-end side wall of the trench-shaped structure.

7. The process according to claim 4, wherein the extension region (70) is produced immediately adjacent to the drain-end side wall of the trench-shaped structure.

8. The process according to claim 4, wherein the drain region (80) and the extension region (70) are produced immediately adjacent to the drain-end side wall of the trench-shaped structure.

9. The process according to claim 4, further comprising producing a spacing distance between the drain-end side wall of the trench-shaped structure and the extension region (70), wherein the spacing distance is between 0.5 μm and 4.0 μm.

10. The process according to claim 1, further comprising producing a spacing distance between the drain-end side wall of the trench-shaped structure and the drain region (80), wherein the spacing distance is between 0.5 μm and 4.0 μm.

11. The process according to claim 4, further comprising producing a spacing distance between the drain-end side wall of the trench-shaped structure and the drain region (80), wherein the spacing distance is between 0.5 μm and 4.0 μm.

12. The process according to claim 4, further comprising producing a spacing distance between the drain-end side wall of the trench-shaped structure and the extension region (70), and between the drain-end side wall and the drain region (80), wherein the spacing distance is between 0.5 μm and 4.0 μm.

13. The process according to claim 1, wherein the first concentration value, the second concentration value, and the third concentration value are each higher than a doping concentration level in the body region (18).

14. The process according to claim 8, wherein the first concentration value, the second concentration value, and the third concentration value are each higher than a doping concentration level in the body region (18).

15. The process according to claim 12, wherein the first concentration value, the second concentration value, and the third concentration value are each higher than a doping concentration level in the body region (18).

16. The process according to claim 1, wherein the second and third concentration values are equal.

17. The process according to claim 8, wherein the second and third concentration values are equal.

18. The process according to claim 12, wherein the second and third concentration values are equal.

19. The process according to claim 1, wherein the second concentration value is lower than the third concentration value.

20. The process according to claim 8, wherein the second concentration value is lower than the third concentration value.

21. The process according to claim 12, wherein the second concentration value is lower than the third concentration value.

22. The process according to claim 1, wherein the trench-shaped structure is produced so as to have an aspect ratio above 0.5 and a width between 0.5 μm and 4.0 μm.

23. The process according to claim 1, wherein the trench-shaped structure is produced by STI etching, and further comprising filling the trench-shaped structure with an isolating material, comprising an oxide.

24. The process according to claim 1, wherein the trench-shaped structure is filled with an oxide produced by a LOCOS oxidation.

25. The process according to claim 1, wherein the semiconductor body further features an isolating intermediate layer (4) below the surface layer, and the DMOS transistor is produced in the surface layer.

26. The process according to claim 25, wherein a portion of the surface layer between the trench-shaped structure and the intermediate layer has a thickness between one half and five times a depth of the trench-shaped structure.

27. The process according to claim 1, wherein a portion of the surface layer underneath the trench-shaped structure has a thickness between one half and five times a depth of the trench-shaped structure.

28. The process according to claim 25, wherein the two well region (19, 20), and the body region (18), and the source region (10), and at least one of the drain region (80) and the extension region (70), are each produced immediately adjacent to the isolating intermediate layer (4).

29. The process according to claim 1, wherein the first concentration value in the floor region is independent from and greater than at least one of the second and third concentration values in the side walls.

30. The process according to claim 1, wherein the third concentration value in the drain-end side wall is higher than the first concentration value in the floor region, which is higher than the second concentration value in the source-end side wall.

31. The process according to claim 1, wherein at least some of the doping in the side wails is produced by implantation before forming the trench-shaped structure.

32. The process according to claim 31, wherein at least some of the doping in the side walls, and the doping in the floor region are produced by implantation after forming the trench-shaped structure.

33. The process according to claim 1, wherein at least some off the doping in the side walls, and the doping in the floor region are produced by implantation after forming the trench-shaped structure.

34. The process according to claim 1, further comprising forming an oxide protective layer on the side walls before producing the doping in the floor region by dopant implantation.

35. The process according to claim 1, wherein the doping of the second conductivity type is produced respectively in the entire side walls and in the entire floor region.

36. A process of manufacturing a DMOS transistor, comprising the steps:
   a) providing a semiconductor body having a surface;
   b) etching a trench into said semiconductor body from said surface, so that said trench is bounded by a floor and first and second side walls extending from said surface to said floor, wherein said first and second side walls are non-parallel relative to each other and said trench has a tapering cross-section with a greater width between said first and a second side walls at said surface than at said floor;
   c) implanting a dopant into said semiconductor body to result in a first dopant concentration of said dopant in a first wall region of said semiconductor body along a location of said first side wall, a second dopant concentration of said dopant in a second wall region of said semiconductor body along a location of said second side wall, and a third dopant concentration of said dopant in a floor region of said semiconductor body along a location of said floor;
   d) forming in said semiconductor body a source region adjacent to said location of said first side wall;
   e) forming in said semiconductor body a drain region adjacent to said location of said second side wall;
   f) forming in said semiconductor body a first well region of a first conductivity type at a location underlying said source region;
   g) forming in said semiconductor body a second well region of a second conductivity type at a location underlying said drain region;
   h) forming in said semiconductor body a body region of said first conductivity type at a location between said first well region and said second well region; and i) forming a gate structure on said surface of said semiconductor body and adjoining said source region.

37. The process according to claim 36, further comprising forming an oxide protective layer on said side walls after said step b) and before at least said implanting of said dopant into said floor region in said step c).

38. The process according to claim 36, wherein said implanting of said dopant in said step c) is carried out partially before said step b) and partially after said step b).

39. The process according to claim 36, wherein said implanting of said dopant in said step c) comprises implanting said dopant at least into said first wall region and said second wall region in said semiconductor body before said etching of said trench in said step b), and then performing said etching to form said first side wall along said first wall region and to form said second side wall along said second wall region.

40. The process according to claim 39, wherein said implanting of said dopant before said step b) is performed at a non-perpendicular inclined angle relative to said surface of said semiconductor body.

41. The process according to claim 39, wherein said implanting of said dopant in said step c) further comprises implanting said dopant into said floor region and additionally into at least said second wall region in said semiconductor body after said etching of said trench in said step b).

42. The process according to claim 36, wherein said implanting of said dopant in said step c) comprises implanting said dopant into at least said floor region in said semiconductor body after said etching of said trench in said step b).

43. The process according to claim 42, further comprising forming an oxide protective layer on said side walls after said step b) and before said implanting of said dopant into said floor region.

44. The process according to claim 42, wherein said implanting of said dopant after said etching of said trench in said step b) comprises a first implantation of said dopant oriented perpendicular to said surface into said floor region, and a second implantation of said dopant oriented at a non-perpendicular inclined angle relative to said surface into said second wall region.

45. The process according to claim 36, wherein said implanting of said dopant is carried out so that said second dopant concentration in said second wall region is higher than said first dopant concentration in said first wall region.

46. The process according to claim 45, wherein said third dopant concentration in said floor region is between said first and second dopant concentrations.

47. A process of manufacturing a DMOS transistor, comprising the steps:
   a) providing a semiconductor body having a surface;
   b) implanting a first dopant into said semiconductor body to form a first doped region that is doped with said first dopant;
   c) after said step b), etching a trench from said surface into said first doped region in said semiconductor body, so that said trench is bounded by a floor, a first side wall, extending from said surface to said floor, and a second side wall extending from said surface to said floor;
   d) after said step c), implanting a second dopant through said trench into said floor so as to produce a third dopant concentration of said second dopant in a floor region extending along said floor in said semiconductor body;
   e) forming in said semiconductor body a source region adjacent to said first side wall;
   f) forming in said semiconductor body a drain region adjacent to said second side wall;
   g) forming in said semiconductor body a first well region of a first conductivity type underlying said source region;
   h) forming in said semiconductor body a second well region of a second conductivity type underlying said drain region;
   i) forming in said semiconductor body a body region of said first conductivity type between said first well region and said second well region; and
   j) forming a gate structure on said surface of said semiconductor body and adjoining said source region.

48. The process according to claim 47, further comprising forming an oxide protective layer on said side walls after said step c) and before said step d).

* * * * *

UNITED STATES PATENT AND TRADEMARK OFFICE
CERTIFICATE OF CORRECTION

PATENT NO. : 6,806,131 B2
DATED : October 19, 2004
INVENTOR(S) : Bromberger et al.

It is certified that error appears in the above-identified patent and that said Letters Patent is hereby corrected as shown below:

Title page,
Item [56], References Cited, FOREIGN PATENT DOCUMENTS, after "JP", replace "2001-12842" by -- 2000-12842 --;

Column 4,
Line 6, after "structure.", replace "it" by -- It --;

Column 6,
Line 31, after "direction.", replace "Also,-the" by -- Also, the --;

Column 8,
Line 18, after "region,", insert -- a --;
Line 43, after "gate region", insert -- on --;

Column 10,
Line 17, after "side", replace "wails" by -- walls --;
Line 43, after "and", delete "a" ;

Column 12,
Line 15, after "wall", delete "," .

Signed and Sealed this

Sixteenth Day of August, 2005

JON W. DUDAS
*Director of the United States Patent and Trademark Office*